United States Patent
Park et al.

(10) Patent No.: US 7,595,665 B2
(45) Date of Patent: Sep. 29, 2009

(54) CLOCK GATED CIRCUIT

(75) Inventors: Jin-soo Park, Yongin-si (KR); Gun-ok Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/009,903

(22) Filed: Jan. 23, 2008

(65) Prior Publication Data

US 2008/0204081 A1    Aug. 28, 2008

(30) Foreign Application Priority Data

Feb. 28, 2007    (KR) .................. 10-2007-0020573

(51) Int. Cl.
*H03K 19/096*    (2006.01)
(52) U.S. Cl. ........................................... 326/95
(58) Field of Classification Search ............. 326/82–87, 326/95
See application file for complete search history.

(56) References Cited

U.S. PATENT DOCUMENTS

| | | | |
|---|---|---|---|
| 6,952,118 B2 | 10/2005 | Jamshidi et al. | |
| 6,965,254 B2 * | 11/2005 | Lundberg | 326/98 |
| 7,116,150 B2 | 10/2006 | Francom | |
| 2006/0097754 A1 | 5/2006 | Kim | |
| 2007/0200597 A1 * | 8/2007 | Oakland | 326/46 |

FOREIGN PATENT DOCUMENTS

| | | |
|---|---|---|
| KR | 1998-064728 | 11/1998 |
| KR | 10-2006-0040384 | 10/2006 |

* cited by examiner

*Primary Examiner*—Rexford N Barnie
*Assistant Examiner*—Thienvu V Tran
(74) *Attorney, Agent, or Firm*—Mills & Onello LLP

(57) ABSTRACT

A clock gated circuit includes a clock signal receiving unit that applies a first voltage to a fighting node when the clock signal is at a first logic; a discharging unit that discharges an electric charge from the fighting node when the clock signal is transitioned from the first logic to a second logic and when the enable signal is activated; a voltage maintaining unit that maintains the fighting node at a power or ground voltage; and an output unit that inverts a logic level of the fighting node to generate the gated clock signal. A blocking unit can be included that blocks a power voltage from being provided to the fighting node by the voltage maintaining unit when discharging. A blocking transistor can be included that prevents unnecessary electric charge from inflowing into the fighting node to reduce power consumption and discharging time.

18 Claims, 7 Drawing Sheets

CLOCK GATED CIRCUIT

CROSS-REFERENCE TO RELATED PATENT APPLICATION

This application claims the benefit of priority to Korean Patent Application No. 10-2007-0020573, filed on Feb. 28, 2007, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a clock gated circuit including a transistor that prevents unnecessary electric charge from inflowing into a "fighting node" to reduce power consumption and discharging time.

2. Description of the Related Art

Figure 1:
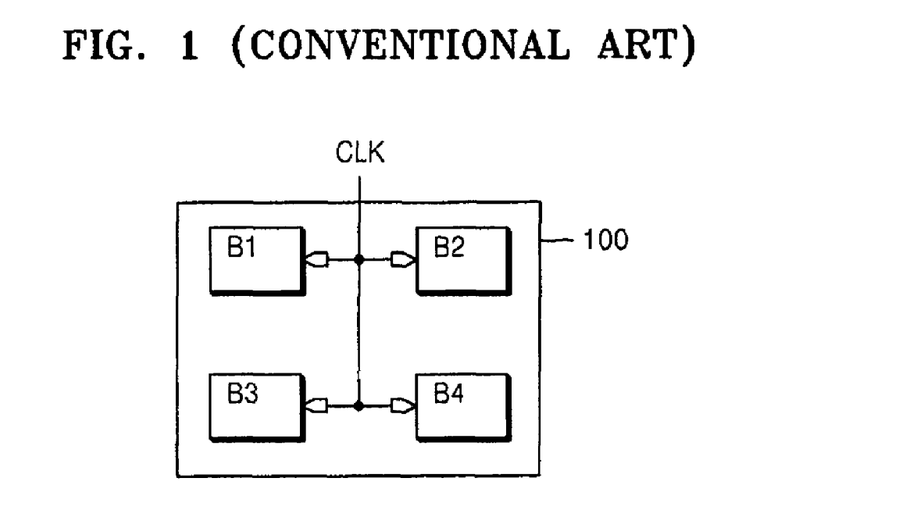
FIG. 1 is a schematic block diagram of a prior art semiconductor chip including a plurality of blocks operated by being synchronized with one clock signal.

In one semiconductor chip, a plurality of blocks can be included according to the function of the semiconductor chip. FIG. 1 is a schematic block diagram of a semiconductor chip including a plurality of blocks. Referring to FIG. 1, the semiconductor chip 100 includes four blocks B1 through B4. The four blocks B1 through B4 are synchronized with one clock signal CLK during operation.

However, in contrast to the current trend that requires low power, activation of unnecessary blocks causes a waste of power. In particular, with the decreased size of semiconductor chips, power consumption due to leakage of power has been a cause of trouble, rather than power consumption due to power consumption during operation. Thus, various methods to prevent power consumption have been introduced to overcome such a problem. One of the methods employs a clock gated circuit. The clock gated circuit includes a latch circuit and is called a clock gating latch positive circuit (CGLP).

Figure 2:
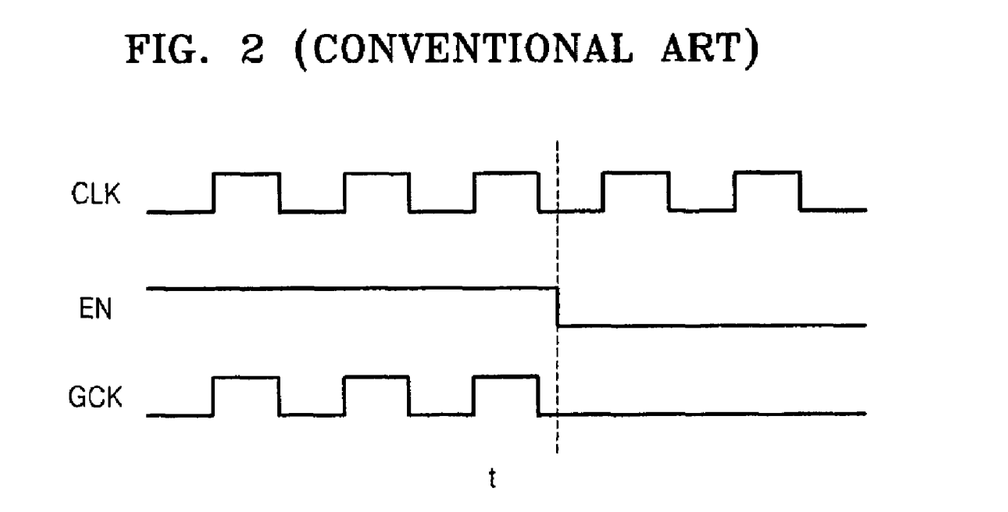
FIG. 2 is a timing diagram conceptually illustrating an operation of a clock gated circuit in accordance with the prior art.

FIG. 2 is a timing diagram conceptually illustrating an operation of a clock gated circuit in accordance with the prior art.

Referring to FIG. 2, while an enable signal EN is activated, the clock gated circuit generates a gated clock signal GCK which is synchronized with a clock signal CLK. When the enable signal EN is transitioned, that is, deactivated, to logic low L at a predetermined time t, the gated clock signal GCK has a value of logic low L. In this case, a block corresponding to the enable signal EN is charged into a sleeping mode so that the block can be deactivated when the block is not in an active mode.

Figure 3:
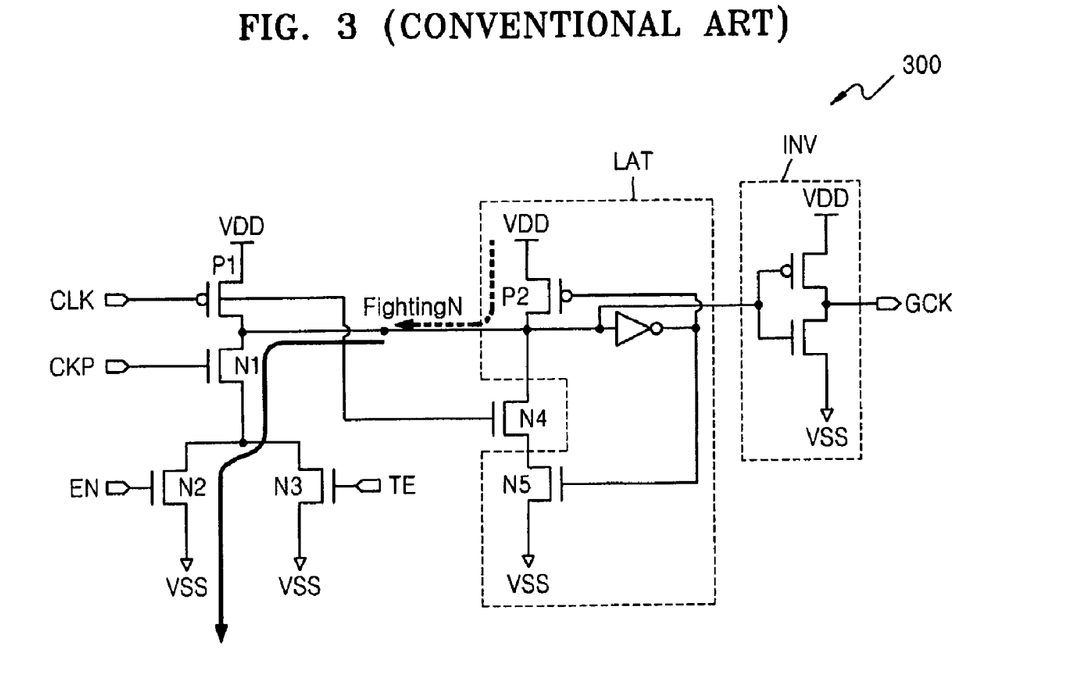
FIG. 3 is a diagram of a general clock gated in accordance with the prior art.

FIG. 3 is a diagram illustrating a general clock gated circuit in more detail, in accordance with the prior art.

Figure 4:
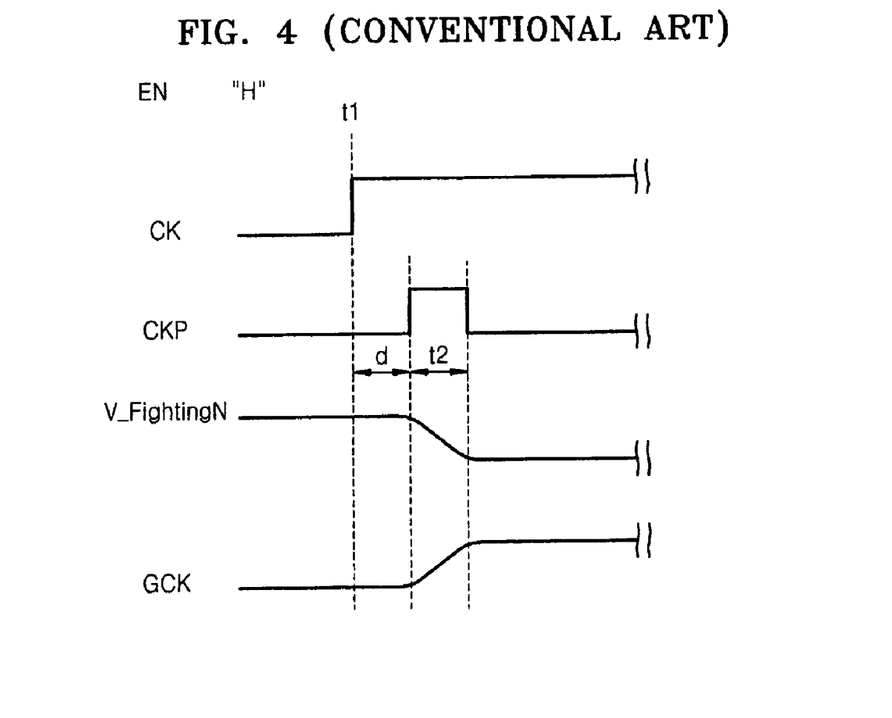
FIG. 4 is a timing diagram illustrating an operation of the clock gated circuit of FIG. 3 when discharging occurs in accordance with the prior art.

FIG. 4 is a timing diagram illustrating an operation of the clock gated circuit of FIG. 3 during a discharging operation, in accordance with the prior art.

An operation of the clock gated circuit 300 in a section where an enable signal EN is activated will be described with reference to FIGS. 3 and 4. When the enable signal EN is activated with logic high H, second and third NMOS transistors N2 and N3 are turned on.

A first PMOS transistor P1 is turned on when a clock signal CLK is logic low L and as such applies power voltage to a fighting node FightingN. On the other hand, the first PMOS transistor P1 is turned off when a clock signal CLK is logic high H.

When a clock signal CLK is transitioned from logic low L to logic high H at a predetermined time t1, a clock pulse signal CKP is activated after a predetermined delay d. When a clock pulse signal CKP is activated with logic high H, a first NMOS transistor N1 is turned on. Thus, an electric charge of the fighting node FightingN is discharged (indicated by a solid arrow in FIG. 3). However, due to a second PMOS transistor P2 in a latch circuit LAT, an electric charge can be provided to the fighting node FightingN (indicated by a dashed line arrow in FIG. 3).

In other words, as the first through third NMOS transistors N1 through N3 and the second PMOS transistor P2 are turned on at the same time, unnecessary power leakage can occur. In addition, since an electric charge is provided by the second PMOS transistor P2, an electric charge in the fighting node FightingN is not fully discharged in the required amount of time. Therefore, delay due to a discharging operation occurs and reliability of the clock gated circuit may decrease.

Furthermore, a discharge occurs in the fighting node FightingN if sizes of the first through third NMOS transistors N1 through N3 are larger than that of the second PMOS transistor P2. However, when the size of the second PMOS transistor P2 is larger than that of the first through third NMOS transistors N1 through N3 due to process reasons, the clock gated circuit cannot be operated.

As such, in a discharging section of the fighting node FightingN, a path for providing an electric charge to the FightingN is formed so that problems such as a waste of power, occurrence of delay, and reliability decrease result.

SUMMARY OF THE INVENTION

In accordance with the present invention, there is provided a clock gated circuit that prevents power consumption occurring due to inflow of unnecessary electric charge to a fighting node when discharging occurs.

According to an aspect of the present invention, there is provided a clock gated circuit including: a clock signal receiving unit configured to apply a first voltage to a fighting node when a clock signal is at a first logic; a discharging unit configured to discharge an electric charge from the fighting node when the clock signal is transitioned from the first logic to a second logic and when an enable signal is activated; a voltage maintaining unit configured to maintain the fighting node at one of a power voltage or a ground voltage; an output unit configured to invert a logic level of the fighting node to generate a gated clock signal; and a blocking unit configured to block a power voltage from being provided to the fighting node by the voltage maintaining unit when discharging occurs. The gated clock signal is fixed at a specific logic level when the enable signal is deactivated, regardless of a logic level of a clock signal.

The first logic can be logic low and the first voltage can be a power voltage.

The voltage maintaining unit can include: a first maintaining transistor that is gated by a control signal to be inverted a logic level of a voltage of the fighting node, one end of the first maintaining transistor being connected to a power voltage source; and a second maintaining transistor that is gated by the control signal, one end of the second maintaining transistor being connected to a ground voltage source.

The first maintaining transistor can be a PMOS transistor and the second maintaining transistor can be a NMOS transistor.

The blocking unit can include a blocking transistor that is gated by the clock signal, one end of the blocking transistor being connected to the other end of the first maintaining transistor and the other end of the blocking transistor being connected to the fighting node.

The blocking transistor can be a PMOS transistor.

The clock gated circuit can include a blocking prevention unit configured to prevent the blocking of a power voltage provided to the fighting node by the voltage maintaining unit, when the clock signal is at the second logic and the enable signal is deactivated before the fighting node is fully discharged.

The blocking prevention unit can further include a blocking prevention transistor that is turned on when the enable signal is deactivated and is connected in parallel with the blocking transistor between the other end of the first maintaining transistor and the fighting node.

The blocking prevention transistor can be a PMOS transistor.

The voltage maintaining unit can further include a third maintaining transistor that can be the same type of transistor as the second maintaining transistor and is gated by the clock signal, one end of the third maintaining transistor being connected to the fighting node and the other end of the third maintaining transistor being connected to the other end of the second maintaining transistor.

The voltage maintaining unit can further include an inverter configured to invert a logic level of the fighting node and to apply the inverted logic level to gates of the first and second maintaining transistors.

The discharging unit can be configured to discharge an electric charge of the fighting node in response to an activation of a clock pulse signal.

The discharging unit can include: a first discharge transistor that is configured to be turned on in response to an activation of the clock pulse signal; and a second discharge transistor that is configured to be turned on in response to an activation of the enable signal, wherein the first and second discharge transistors are connected to each other in series between the fighting node and a ground terminal.

The first and second discharge transistors can be NMOS transistors.

The clock gated circuit can further include a clock pulse generation unit configured to generate the clock pulse signal.

The clock pulse generation unit can include: at least one delay unit configured to delay the clock signal for a predetermined time; and a clock pulse generation unit configured to activate the clock pulse signal in an internal where the clock signal and the delayed clock signal are all second logic.

The clock signal receiving unit can further include a PMOS transistor that is gated by the clock signal, one end of the PMOS transistor being connected to a power voltage terminal and the other end of the PMOS transistor being connected to the fighting node.

The output unit can include an inverter that inverts the logic level of the fighting node.

According to another aspect of the present invention, there is provided a clock gated circuit including: a clock signal receiving unit configured to apply a first voltage to a fighting node when a clock signal is at a first logic; a discharging unit configured to discharge an electric charge from the fighting node when the clock signal is transitioned from the first logic to a second logic and when an enable signal is activated; a voltage maintaining unit configured to maintain the fighting node at one of a power voltage or a ground voltage; an output unit configured to invert a logic level of the fighting node to generate a gated clock signal; a blocking unit configured to block a power voltage from being provided to the fighting node by the voltage maintaining unit when discharging occurs; and a blocking prevention unit configured to prevent blocking of a power voltage provided to the fighting node by the voltage maintaining unit, when the clock signal is at the second logic and the enable signal is deactivated before the fighting node is fully discharged. The gated clock signal is fixed at a specific logic level when the enable signal is deactivated, regardless of a logic level of the clock signal.

The voltage maintaining unit can comprise: a first maintaining transistor that is gated by a control signal configured to invert a logic level of the fighting node, one end of the first maintaining transistor being connected to a power voltage source; and a second maintaining transistor that is gated by the control signal, one end of the second maintaining transistor being connected to a ground voltage source.

The blocking unit can comprise: a blocking transistor that is gated by the clock signal, one end of the blocking transistor being connected to the other end of the first maintaining transistor and the other end of the blocking transistor being connected to the fighting node.

The blocking prevention unit can comprise: a blocking prevention transistor that is turned on when the enable signal is deactivated and is connected in parallel with the blocking transistor between the other end of the first maintaining transistor and the fighting node.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF PREFERRED EMBODIMENTS

Hereinafter, various aspects of the present invention will be described more fully with reference to the accompanying drawings, in which exemplary embodiments in accordance therewith are shown.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 5:
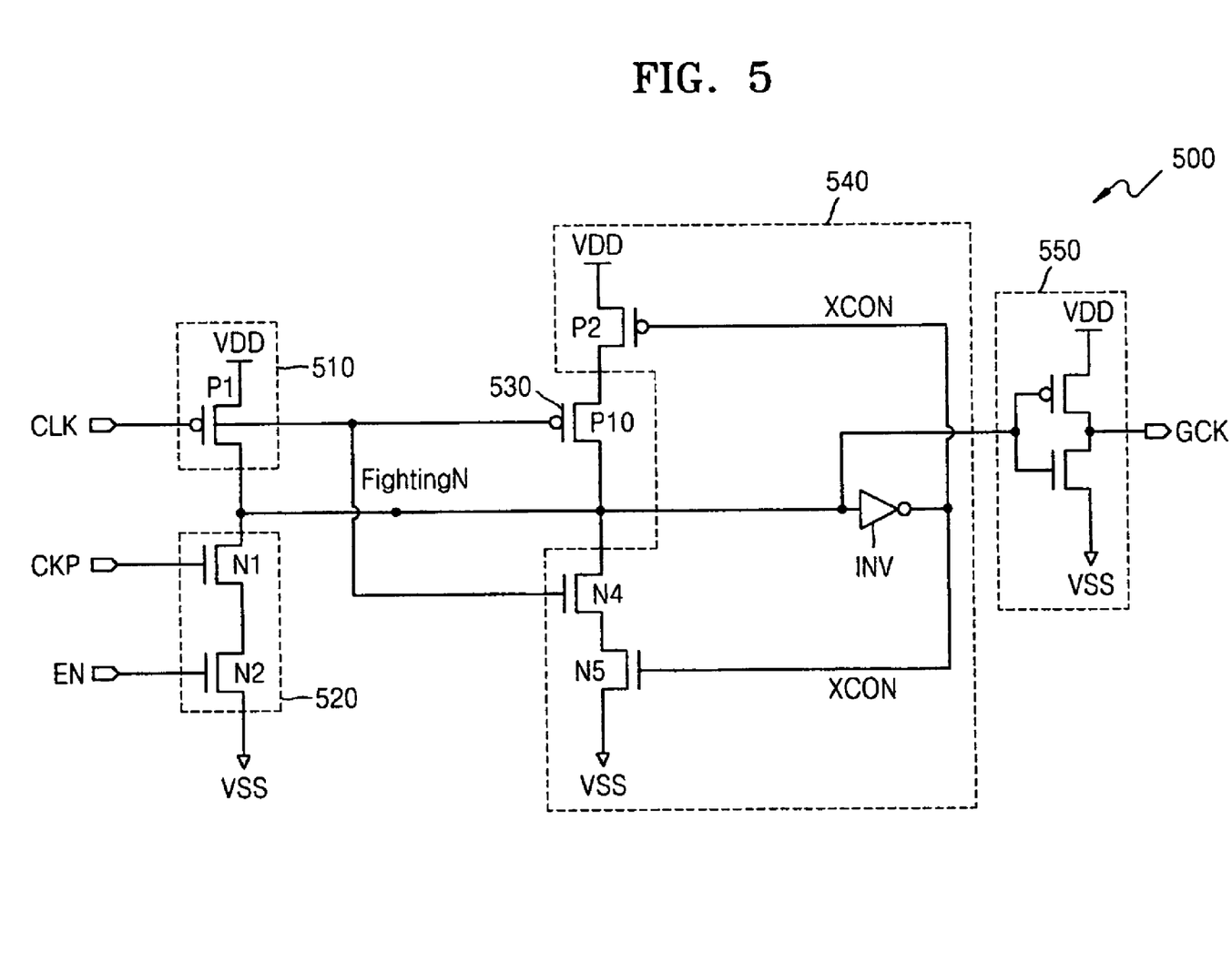
FIG. 5 is a circuit diagram of an embodiment of a clock gated circuit according to an aspect of the present invention.

FIG. 5 is a circuit diagram of an embodiment of a clock gated circuit according to an aspect of the present invention.

Referring to FIG. 5, a clock gated circuit 500 according to the current embodiment includes a clock signal receiving unit 510, a discharging unit 520, a voltage maintaining unit 540, an output unit 550, and a blocking unit 530.

The clock signal receiving unit 510 includes a first PMOS transistor, the first PMOS transistor is configured to apply a power voltage VDD to a fighting node FightingN when a clock signal CLK is logic low L. The output unit 550 includes an inverter, wherein the inverter inverts a logic level of the fighting node FightingN so that a gated clock signal GCK is generated.

As mentioned above, the clock gated circuit generates a gated clock signal, which is synchronized with a clock signal, when an enable signal EN is activated. Also, the clock gated circuit generates a gated clock signal fixed to a specific logic level regardless of a logic level of a clock signal CLK, when an enable signal EN is deactivated. In this case, the clock gated circuit can be fixed to a logic low L.

Hereinafter, an operation of the clock gated circuit 500, that is, an operation of generating a gated clock signal that is synchronized with a clock signal when an enable signal is activated, will be firstly described and an operation of generating a gated clock signal fixed to a logic low when an enable signal is deactivated will be described thereafter.

When a clock signal CLK is logic low L, power voltage VDD is applied to the fighting node FightingN. The inverter INV inverts a logic level of the fighting node FightingN so that a gated clock signal GCK of logic low L is generated.

When a clock signal CLK is transitioned from logic low L to logic high H, the first PMOS transistor P1 is turned off. Also, an electric charge of the fighting node FightingN is discharged. Discharging in the fighting node FightingN is performed by the discharging unit 520. The discharging unit 520 will be described in more detail.

The discharging unit 520 can include a first discharge transistor N1 and a second discharge transistor N2, wherein the first discharge transistor N1 is turned on in response to an activation of a clock pulse signal CKP and the second discharge transistor N2 is turned on in response to an activation of an enable signal EN. The first discharge transistor N1 and the second discharge transistor N2 can be connected to each other in series between the fighting node FightingN and a ground terminal VSS. In FIG. 5, the first discharge transistor N1 and the second discharge transistor N2, which are NMOS transistors in this embodiment, are illustrated.

Figure 9:
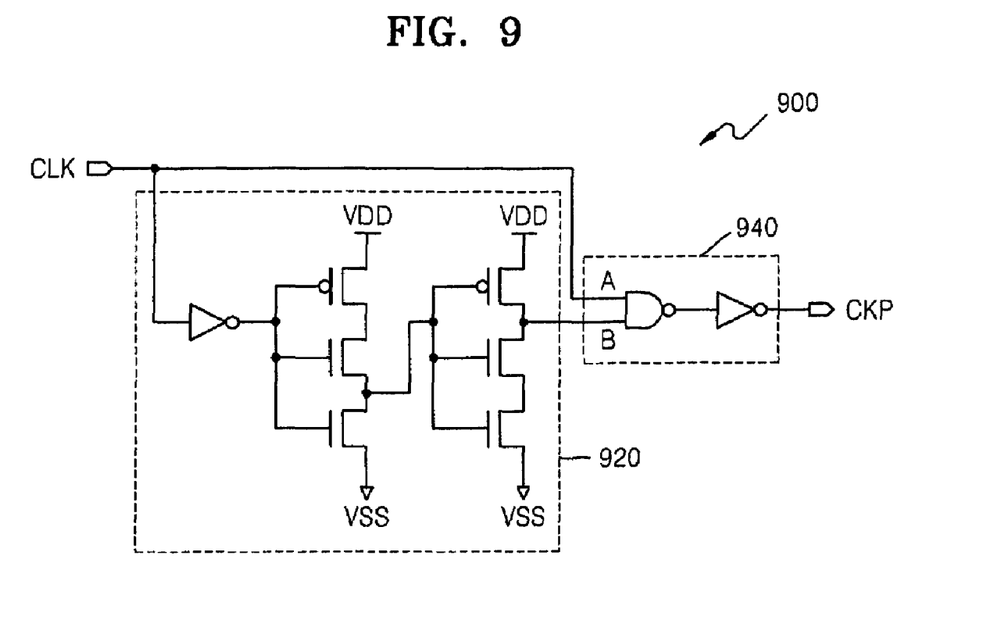
FIG. 9 is a circuit diagram of a clock pulse generation unit which generates a clock pulse signal of FIGS. 5 through 8.

The clock gated circuit 500 can further include a clock pulse generation unit 900 configured to generate a clock pulse signal CKP. FIG. 9 is a circuit diagram of an embodiment of the clock pulse generation unit 900 which generates the clock pulse signal CKP.

Referring to FIGS. 5 and 9, the clock pulse generation unit 900 includes a delay unit 920 and a clock signal generation unit 940. The delay unit 920 delays a clock signal CLK for a predetermined time. The delay unit 920 can be an inverter, for example. The clock signal generation unit 940 activates a clock pulse signal CKP when a clock signal (A) and a delayed clock signal (B) are both logic high H. In other words, a clock pulse signal CKP is activated for a predetermined time (e.g., t2 of FIG. 4) when a clock signal CLK is transitioned from logic low L to logic high H.

Referring back to FIG. 5, when a clock signal CLK is transitioned to logic high H, a clock pulse signal CKP is activated so that the first discharge transistor N1 is also turned on. Thus, an electric charge in the fighting node FightingN is discharged to a ground terminal VSS. During a discharging operation, the blocking unit 530 blocks power voltage VDD from being provided to the fighting node FightingN by the voltage maintaining unit 540.

The voltage maintaining unit 540 maintains the fighting node FightingN at a power voltage VDD or at a ground voltage VSS. The voltage maintaining unit 540 includes a first maintaining transistor P2 and a second maintaining transistor N5, wherein the first maintaining transistor P2 maintains the fighting node FightingN to a power voltage VDD when the fighting node FightingN is a high level voltage H and the second maintaining transistor N5 maintains the fighting node FightingN to a ground voltage VSS when the fighting node FightingN is a low level voltage L.

In FIG. 5, the first maintaining transistor P2 is illustrated as a PMOS transistor that responds to a control signal XCON to be gated by inverting a logic level of a voltage of the fighting node FightingN. One end of the first maintaining transistor P2 is connected to a power voltage source VDD and the other end of the first maintaining transistor P2 is connected to a blocking transistor P10. In addition, in FIG. 5, the second maintaining transistor N5 is illustrated as a NMOS transistor that responds to a control signal XCON to be gated, wherein one end of the second maintaining transistor N5 is connected to a ground terminal VSS.

The voltage maintaining unit 540 can further include an inverter that inverts a logic level of a voltage of the fighting node FightingN to apply to gates of the first maintaining transistor P2 and the second maintaining transistor N5.

In addition, the voltage maintaining unit 540 can further include a third maintaining transistor N4. In FIG. 5, the third maintaining transistor N4 is illustrated as a NMOS transistor that responds to a clock signal CLK to be gated, wherein one end of the third maintaining transistor N4 is connected to the fighting node FightingN and other end of the third maintaining transistor N4 is connected to the other end of the second maintaining transistor N5. The third maintaining transistor N4 can be included to accurately maintain the fighting node FightingN at a ground voltage when a clock signal CLK is still at logic high H, after discharging.

Referring back to FIG. 5, even if discharging occurs in the fighting node FightingN, the first maintaining transistor P2 also can be turned on until before the voltage of the fighting node FightingN drops below a fixed level. However, as mentioned above, the power voltage VDD applied after the first maintaining transistor P2 is turned on is blocked from being applied to the fighting node FightingN by the blocking unit 530.

In FIG. 5, the blocking unit 530 is illustrated as a PMOS transistor P10 that responds to a clock signal CLK to be gated, wherein one end of the blocking unit 530 is connected to the other end of the first maintaining transistor P2 and the other end of the blocking unit 530 is connected to the fighting node FightingN. In other words, while a clock signal CLK is transitioned from logic low L to logic high H and then maintains logic high H, a blocking transistor P10 is turned on. Thus, while discharging occurs in the fighting node FightingN, the power voltage VDD is blocked from being provided to the fighting node FightingN by the first maintaining transistor P2.

As described above, the clock gated circuit according to this embodiment prevents inflow of unnecessary electric charge when discharging, and thus problems such as power consumption can be solved.

Figure 6:
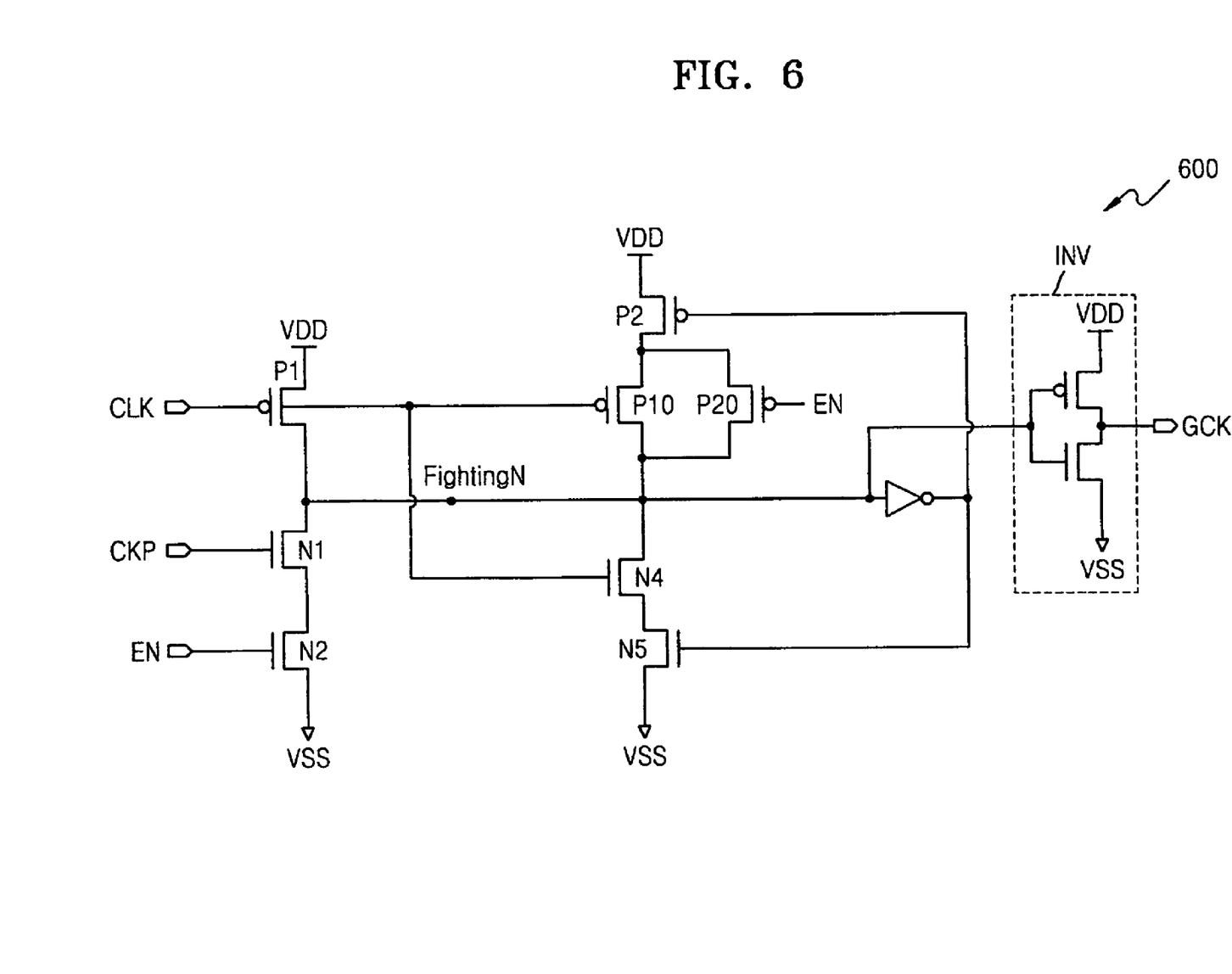
FIG. 6 is a circuit diagram of an embodiment of a clock gated circuit according to another aspect of the present invention.

FIG. 6 is a circuit diagram of an embodiment of a clock gated circuit according to another aspect of the present invention.

Referring to FIGS. 5 and 6, a clock gated circuit 600 of FIG. 6 further includes a blocking prevention unit P20. Other elements of the clock gated circuit 600 are the same as the clock gated circuit 500 illustrated in FIG. 5. Therefore, the description of the clock gated circuit 600 is limited to the blocking prevention unit P20.

The blocking prevention unit P20 prevents blocking of a power voltage VDD being provided to the fighting node FightingN by the blocking transistor P10, when a clock signal CLK is logic high H and an enable signal EN is deactivated before the fighting node FightingN is fully discharged. More specifically, as described above, the clock gated circuit according to the current embodiment prevents power voltage from being provided to the fighting node FightingN by the blocking transistor P10 when discharging. Then the blocking transistor P10 is operated when a clock signal CLK is logic high H.

However, when a clock signal CLK is logic high H and an enable signal EN is deactivated before the fighting node FightingN is fully discharged, a gated clock signal GCK in an incomplete logic state, instead of logic low L, can be generated. As mentioned above, when an enable signal EN is deactivated, a gated clock signal GCK should be fixed at a specific logic level (e.g. logic low L).

In order for a gated clock signal GCK to be accurately fixed at logic low L when an enable signal EN is deactivated, the fighting node FightingN should be fixed at logic high H. Accordingly, the blocking prevention unit P20 prevents blocking of power voltage VDD applied to the fighting node FightingN by the blocking transistor P10. In FIG. 6, the blocking prevention unit P20 is illustrated as a PMOS transistor P20 that responds to an enable signal to be gated and is connected to the blocking transistor P10 in parallel between the other end of the first maintaining transistor P2 and the fighting node FightingN.

Figure 7:
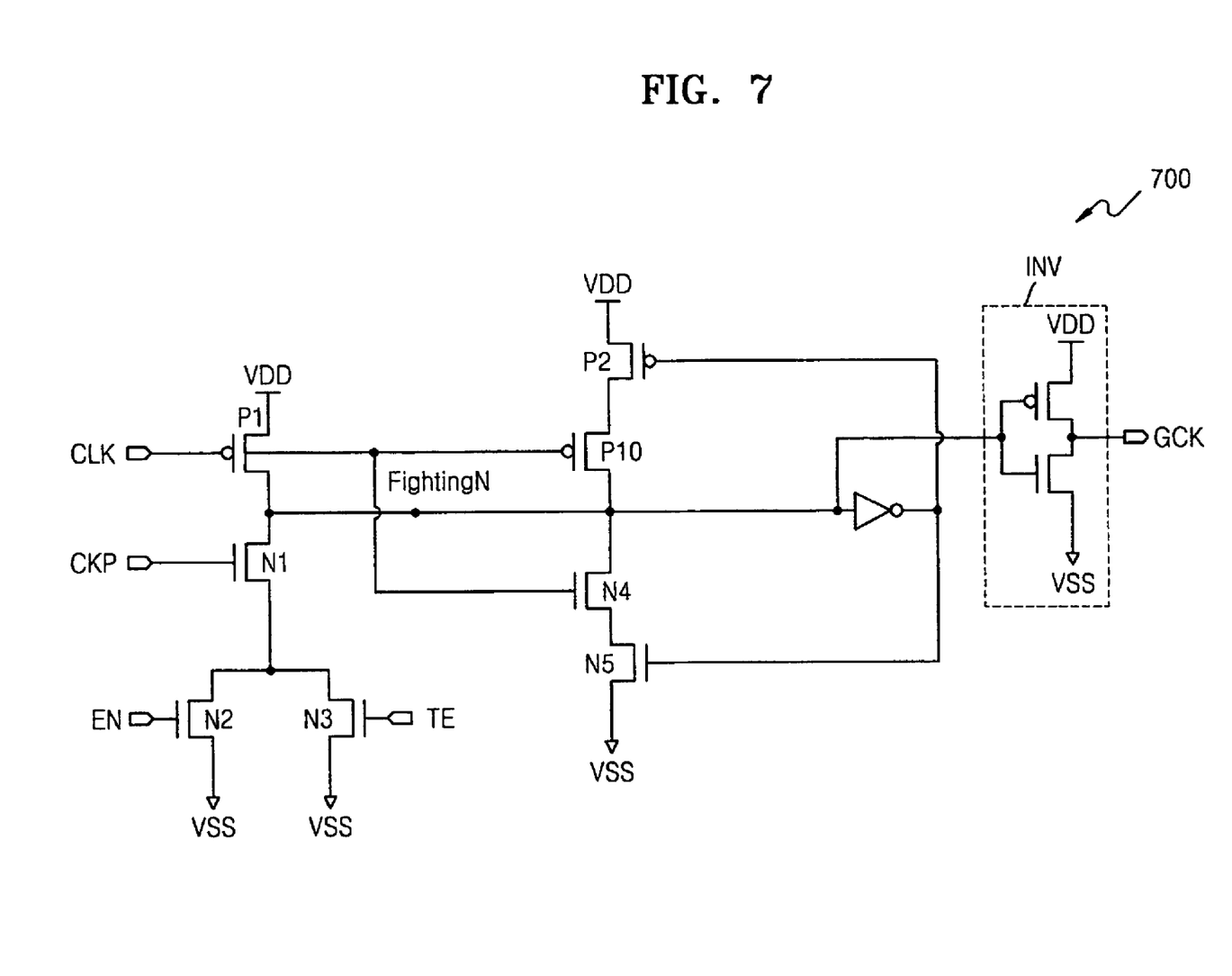
FIG. 7 is a circuit diagram of an embodiment of a clock gated circuit according to another aspect of the present invention.
Figure 8:
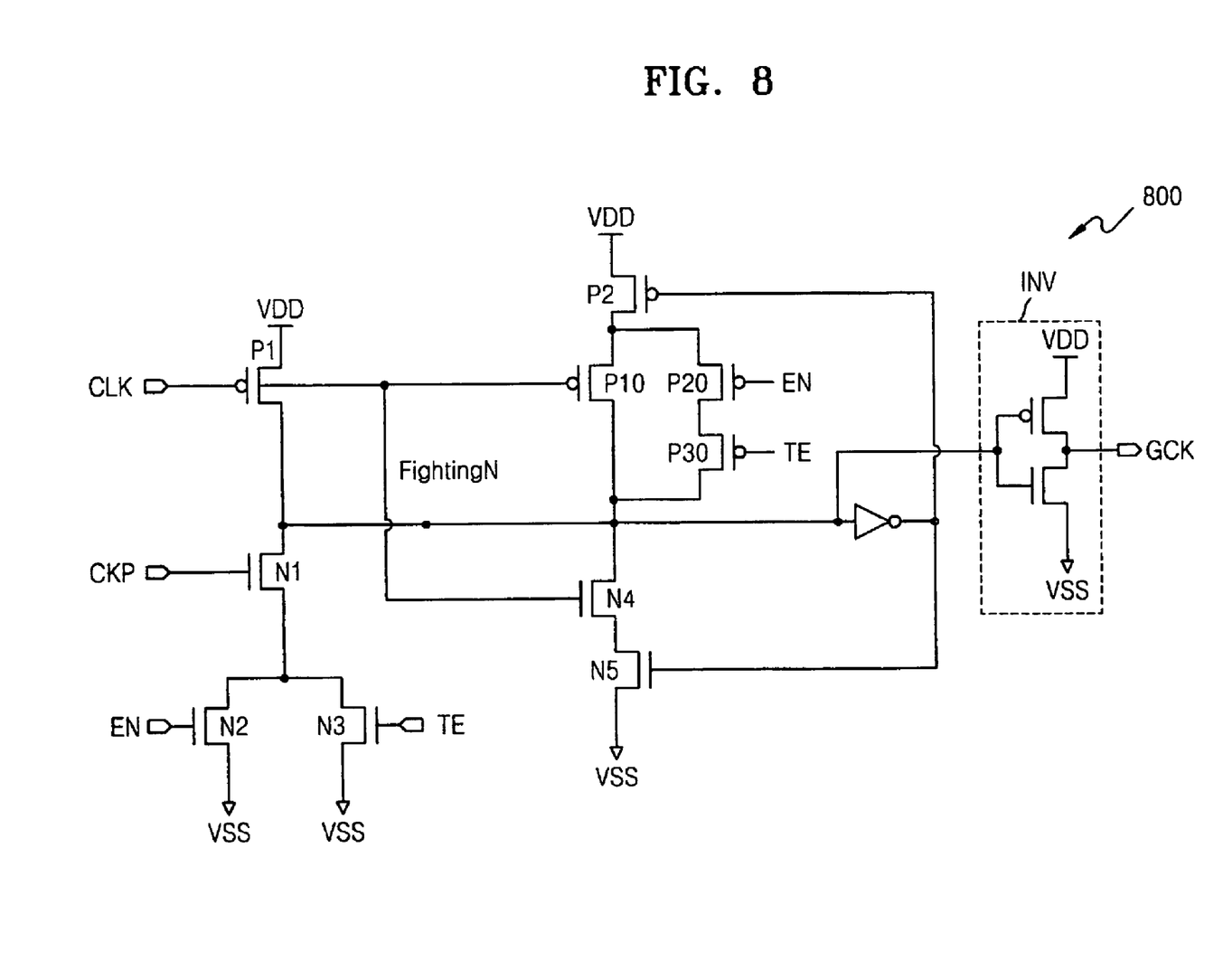
FIG. 8 is a circuit diagram of an embodiment of a clock gated circuit according to another aspect of the present invention.

FIGS. 7 and 8 are circuit diagrams of embodiments of a clock gated circuit according to other aspects of the present invention.

Clock gated circuits 700 and 800 of FIGS. 7 and 8 correspond to the clock gated circuits 500 and 600 of FIG. 5 and 6, respectively. However, unlike to the clock gated circuits 500 and 600 of FIG. 5 and 6, the clock gated circuits 700 and 800 are operated by two enable signals EN and TE.

In FIG. 7, as compared to FIG. 5, an NMOS transistor N3 is placed in parallel with transistor N2. Signal TE is applied to the gate of transistor N3. EN and TE can be applied to transistors N2 and N3, respectively, at substantially the same time to discharge the fighting node FightingN.

In FIG. 8, as compared to FIG. 6, a blocking prevention unit includes PMOS transistor P3 in series with transistor P2. EN and TE can be applied to transistors P2 and P3, respectively, at substantially the same time to the block power voltage VDD from being provided to the fighting node FightingN.

Beyond those differences, the remaining elements of the clock gated circuits 700 and 800 of FIGS. 7 and 8 correspond to those of the clock gated circuits 500 and 600 of FIG. 5 and 6, respectively Therefore, further detailed description of the clock gated circuits 700 and 800 illustrated in FIGS. 7 and 8 is omitted here for convenience.

Figure 10A:
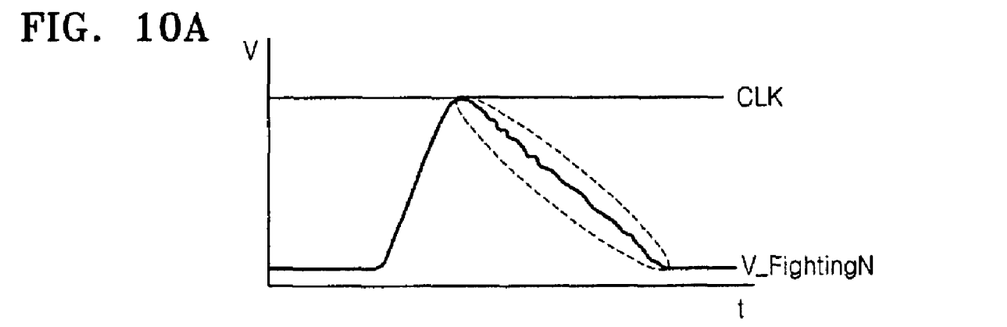
FIG. 10 shows graphs illustrating an improved discharging operation in the clock gated circuit of FIGS. 5 through 8.
Figure 10B:
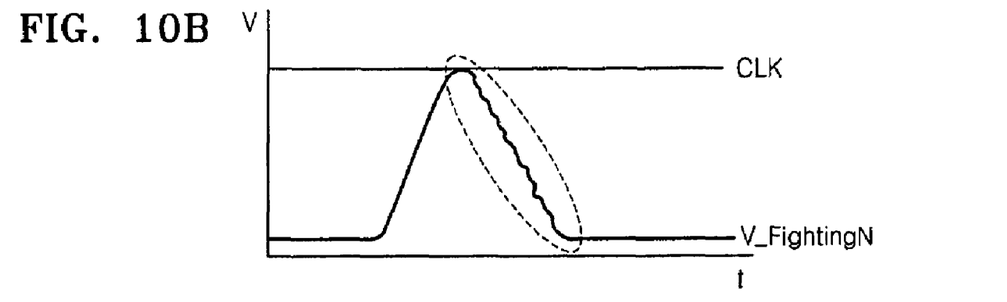

FIG. 10 shows graphs illustrating an improved discharging operation in the clock gated circuit of FIGS. 5 through 8.

A graph (A) of FIG. 10 illustrates a discharging operation in the conventional clock gated circuit 300 and a graph (B) of FIG. 10 illustrates discharging operations in the clock gated circuits 500 through 800. Referring to graphs (A) and (B) in FIG. 10, a fighting node voltage V_FightingN in graph (B) is discharged faster than that the fighting node voltage V_FightingN of in graph (A).

Aspects of the present invention have been particularly shown and described with reference to exemplary embodiments thereof. The terms used herein are for illustrative purposes and are not intended to limit the scope of the invention. For example, in FIG. 7, the second discharge transistor N2 and the third discharge transistor N3 of the clock gated circuit 700 are connected to each other in parallel, however, they can be connected to each other in series in other embodiments.

As described above, the embodiments of the clock gated circuit include a blocking transistor that prevents unnecessary electric charge from inflowing into the fighting node to reduce power consumption and discharging time thereof.

While embodiments in accordance with the present invention have been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A clock gated circuit comprising:
   a clock signal receiving unit configured to apply a first voltage to a fighting node when a clock signal is at a first logic;
   a discharging unit configured to discharge an electric charge from the fighting node when the clock signal is transitioned from the first logic to a second logic and when an enable signal is activated;
   a voltage maintaining unit configured to maintain the fighting node at one of a power voltage or a ground voltage;
   an output unit configured to invert a logic level of the fighting node to generate a gated clock signal;
   a blocking unit configured to block a power voltage from being provided to the fighting node by the voltage maintaining unit when discharging occurs; and
   a blocking prevention unit configured to prevent blocking of a power voltage provided to the fighting node by the voltage maintaining unit, when the clock signal is at the second logic and the enable signal is deactivated before the fighting node is fully discharged, wherein the gated clock signal is fixed at a specific logic level when the enable signal is deactivated, regardless of a logic level of the clock signal.

2. The clock gated circuit of claim 1, wherein the first logic is logic low and the first voltage is a power voltage.

3. The clock gated circuit of claim 2, wherein the voltage maintaining unit comprises:

a first maintaining transistor that is gated by a control signal to be an inverted logic level of a voltage of the fighting node, one end of the first maintaining transistor being connected to a power voltage source; and a second maintaining transistor that is gated by the control signal, one end of the second maintaining transistor being connected to a ground voltage source.

4. The clock gated circuit of claim 3, wherein the first maintaining transistor is a PMOS transistor and the second maintaining transistor is a NMOS transistor.

5. The clock gated circuit of claim 3, wherein the blocking unit comprises:

a blocking transistor that is gated by the clock signal, one end of the blocking transistor being connected to the other end of the first maintaining transistor and the other end of the blocking transistor being connected to the fighting node.

6. The clock gated circuit of claim 5, wherein the blocking transistor is a PMOS transistor.

7. The clock gated circuit of claim 5, wherein the blocking prevention unit comprises:

a blocking prevention transistor configured to turn on when the enable signal is deactivated and is connected in parallel with the blocking transistor between the other end of the first maintaining transistor and the fighting node.

8. The clock gated circuit of claim 7, wherein the blocking prevention transistor is a PMOS transistor.

9. The clock gated circuit of claim 3, wherein the voltage maintaining unit further comprises:

a third maintaining transistor that is the same type of transistor as the second maintaining transistor and is gated by the clock signal, one end of the third maintaining transistor being connected to the fighting node and the other end of the third maintaining transistor being connected to the other end of the second maintaining transistor.

10. The clock gated circuit of claim 3, wherein the voltage maintaining unit further comprises:

an inverter configured to invert a logic level of the fighting node and to apply the inverted logic level to gates of the first and second maintaining transistors.

11. The clock gated circuit of claim 2, wherein the discharging unit is configured to discharge an electric charge of the fighting node in response to an activation of a clock pulse signal.

12. The clock gated circuit of claim 11, wherein the discharging unit comprises:

a first discharge transistor that is configured to be turned on in response to an activation of the clock pulse signal; and a second discharge transistor that is configured to be turned on in response to an activation of the enable signal, wherein the first and second discharge transistors are connected to each other in series between the fighting node and a ground terminal.

13. The clock gated circuit of claim 12, wherein the first and second discharge transistors are NMOS transistors.

14. The clock gated circuit of claim 11, further comprising a clock pulse generation unit configured to generate the clock pulse signal.

15. The clock gated circuit of claim 14, wherein the clock pulse generation unit comprises:

at least one delay unit configured to delay the clock signal for a predetermined time; and a clock pulse generation unit configured to activate the clock pulse signal in an internal where the clock signal and the delayed clock signal are all second logic.

16. The clock gated circuit of claim 2, wherein the clock signal receiving unit further comprises:

a PMOS transistor that is gated by the clock signal, one end of the PMOS transistor being connected to a power voltage terminal and the other end of the PMOS transistor being connected to the fighting node.

17. The clock gated circuit of claim 1, wherein the output unit comprises an inverter configured to invert the logic level of the fighting node.

18. The clock gated circuit of claim 1, wherein the voltage maintaining unit comprises:

a first maintaining transistor that is gated by a control signal configured to invert a logic level of the fighting node, one end of the first maintaining transistor being connected to a power voltage source; and a second maintaining transistor that is gated by the control signal, one end of the second maintaining transistor being connected to a ground voltage source, wherein the blocking unit comprises a blocking transistor that is gated by the clock signal, one end of the blocking transistor being connected to the other end of the first maintaining transistor and the other end of the blocking transistor being connected to the fighting node, wherein the blocking prevention unit comprises a blocking prevention transistor that is turned on when the enable signal is deactivated and is connected in parallel with the blocking transistor between the other end of the first maintaining transistor and the fighting node.

* * * * *